(12) United States Patent
Kang et al.

(10) Patent No.: US 10,777,508 B2
(45) Date of Patent: Sep. 15, 2020

(54) SEMICONDUCTOR DEVICE

(71) Applicant: UNITED MICROELECTRONICS CORP., Hsin-Chu (TW)

(72) Inventors: Chih-Kai Kang, Tainan (TW);
Sheng-Yuan Hsueh, Tainan (TW);
Yi-Chung Sheng, Tainan (TW);
Kuo-Yu Liao, Kaohsiung (TW);
Shu-Hung Yu, Kaohsiung (TW);
Hung-Hsu Lin, Tainan (TW);
Hsiang-Hung Peng, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 82 days.

(21) Appl. No.: 15/347,757

(22) Filed: Nov. 9, 2016

(65) Prior Publication Data
US 2018/0130753 A1    May 10, 2018

(51) Int. Cl.
| | | |
|---|---|---|
| H01L 23/544 | (2006.01) | |
| H01L 27/092 | (2006.01) | |
| H01L 27/02 | (2006.01) | |
| G03F 9/00 | (2006.01) | |
| H01L 21/8238 | (2006.01) | |

(52) U.S. Cl.
CPC .......... *H01L 23/544* (2013.01); *G03F 9/7076* (2013.01); *G03F 9/7084* (2013.01); *H01L 27/0207* (2013.01); *H01L 27/092* (2013.01); *H01L 21/823871* (2013.01); *H01L 2223/5442* (2013.01); *H01L 2223/5446* (2013.01); *H01L 2223/54406* (2013.01); *H01L 2223/54426* (2013.01); *H01L 2223/54433* (2013.01)

(58) Field of Classification Search
CPC .......... H01L 23/544; H01L 2223/54426; H01L 2223/5446
USPC .......................................................... 257/620
See application file for complete search history.

(56) References Cited

U.S. PATENT DOCUMENTS

| | | | |
|---|---|---|---|
| 5,917,205 A | 6/1999 | Mitsui et al. | |
| 6,396,160 B1 | 5/2002 | Schulze et al. | |
| 6,821,867 B2 * | 11/2004 | Matsuura | H01L 23/544 |
| | | | 438/462 |
| 6,987,053 B2 * | 1/2006 | Wu | G03F 7/70633 |
| | | | 438/13 |
| 8,314,502 B2 | 11/2012 | Koketsu et al. | |
| 9,318,607 B2 * | 4/2016 | Seo | H01L 23/5286 |

(Continued)

*Primary Examiner* — Marcos D. Pizarro
*Assistant Examiner* — Quinton A Brasfield
(74) *Attorney, Agent, or Firm* — Winston Hsu (57) ABSTRACT

A semiconductor device includes a substrate including a plurality of chip areas and a scribe line defined thereon, and a mark pattern disposed in the scribe line. The mark pattern includes a plurality of unit cells immediately adjacent to each other, and each unit cell includes a first active region, a second active region isolated from the first active region, a plurality of first gate structures extending along a first direction and arranged along a second direction perpendicular to the first direction, and a plurality of first conductive structures. The first gate structures straddle the first active region and the second active region. The first conductive structures are disposed on the first active region, the second active region, and two opposite sides of the first gate structures.

18 Claims, 10 Drawing Sheets

(56) References Cited

U.S. PATENT DOCUMENTS

| | | | |
|---|---|---|---|
| 2005/0212092 A1* | 9/2005 | Nishizawa | H01L 21/78 257/622 |
| 2007/0296091 A1* | 12/2007 | Yoshida | H01L 23/544 257/797 |
| 2011/0049575 A1* | 3/2011 | Tanaka | H01L 27/11807 257/206 |
| 2013/0075869 A1* | 3/2013 | Mackh | H01L 21/78 257/620 |
| 2015/0356225 A1* | 12/2015 | Lu | H01L 27/092 716/55 |

* cited by examiner

SEMICONDUCTOR DEVICE

BACKGROUND OF THE INVENTION

1. Field of the Invention

The invention relates to a semiconductor device, and more particularly, to a semiconductor device including a mark pattern formed in a scribe line.

2. Description of the Prior Art

Nowadays, integrated circuits (ICs) are used almost everywhere. However, the process of fabricating integrated circuits is complicated and involves four major stages: IC designs, wafer fabrication, wafer testing and wafer packaging. The total number of steps for fabricating an IC chip frequently exceeds a few hundreds.

The fabrication of integrated circuit devices can be roughly divided into three major stages, namely, silicon chip fabrication, integrated circuit fabrication and integrated circuit device packaging. In the integrated circuit fabrication stage, a number of patterns such as alignment marks, monitoring and/or measuring patterns, electrical testing patterns and product codes are formed on wafer scribe lines. Thereafter, the wafer is sawn to produce individual chip ready for carrying out the complicated integrated circuit packaging process.

Typically, the mark pattern is an intact pattern formed by one material layer occupying a large area. That is, a pattern density in the scribe line is much lower than a pattern density in the chip area. Loading effect is therefore caused by the density difference therebetween. As a result, etching rate in the chip area is made lower than that in the scribe line. In other words, loading effect adversely affects at least the reliability of the semiconductor IC fabrication. Furthermore, the conventional mark pattern is respectively formed in one layer, it is found that the mark pattern therefore fails the layer-to-layer integration consideration.

In view of the above, there exists a need for providing a mark pattern that mitigates loading effect and improves the layer-to-layer integration.

SUMMARY OF THE INVENTION

According to an aspect of the present invention, a semiconductor device is provided. The semiconductor device includes a substrate including a plurality of chip areas and a scribe line defined thereon, and a mark pattern disposed in the scribe line. The mark pattern includes a plurality of unit cells immediately adjacent to each other, and each unit cell includes a first active region, a second active region isolated from the first active region, a plurality of first gate structures extending along a first direction and arranged along a second direction perpendicular to the first direction, and a plurality of first conductive structures. The first gate structures straddle the first active region and the second active region. The first conductive structures are disposed on the first active region, the second active region, and on two opposite ends of the first gate structures.

According to the semiconductor device provided by the present invention, the mark pattern formed in the scribe line is constructed by the plurality of unit cells, and each unit cells includes configurations identical to the devices formed in the chip areas. Therefore, pattern densities in the scribe line and the chip areas are made the same, and thus loading effect is mitigated. Furthermore, since the unit cells respectively include elements formed in different layers, it is concluded that at least those layers are involved for constructing the unit cells. Thus layer-to-layer integration is easily achieved.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1:
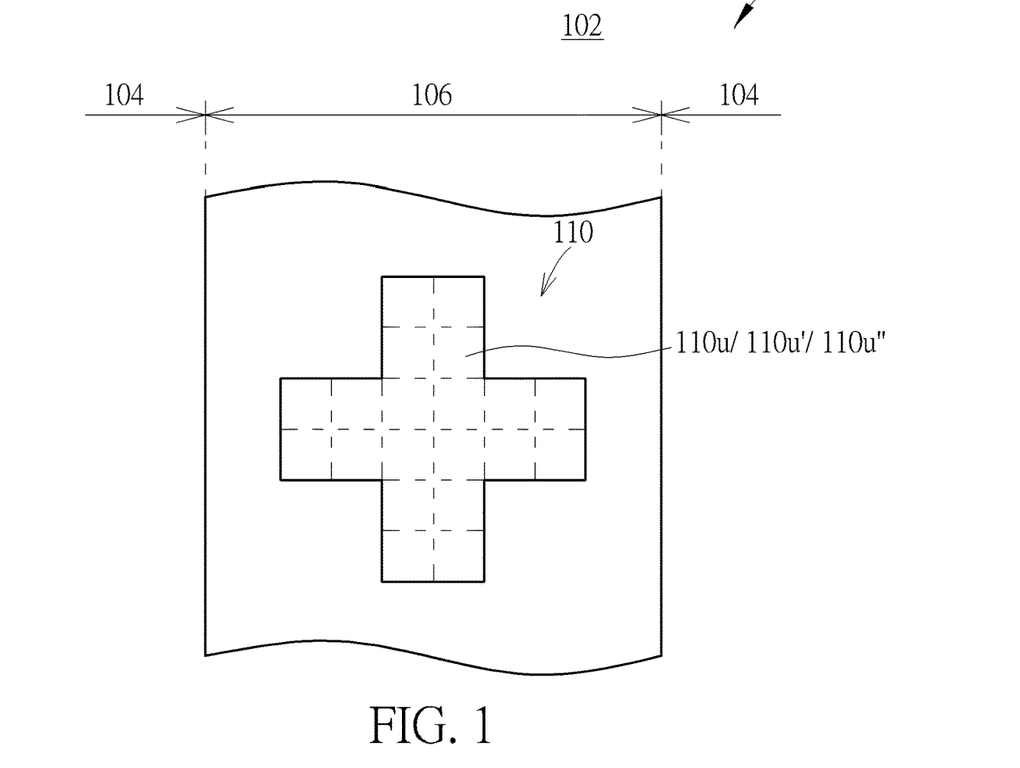
FIGS. 1 and 2 are schematic drawings respectively illustrating a semiconductor device including a mark pattern provided by embodiments of the present invention.
Figure 2:
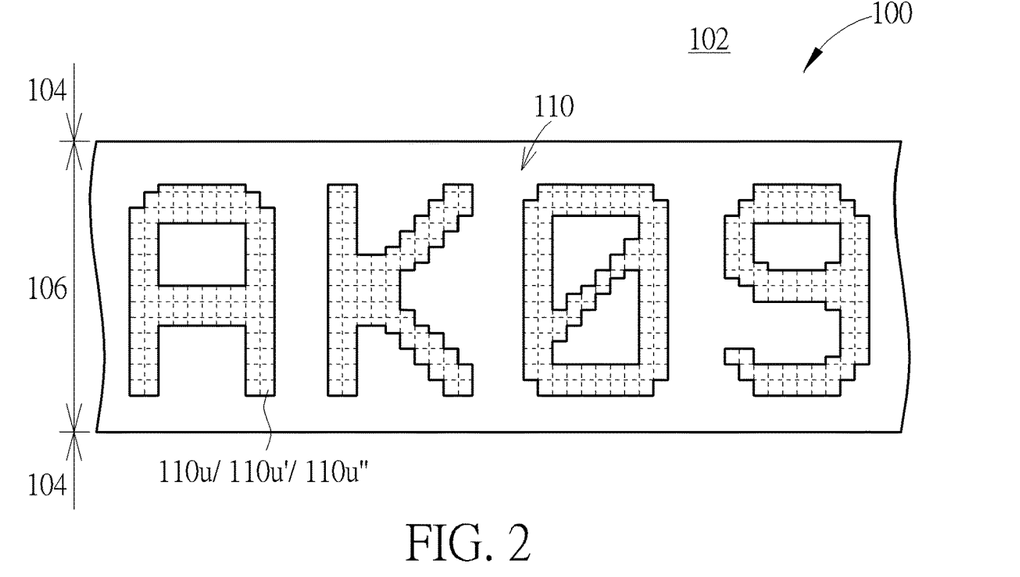

Please refer to FIGS. 1 and 2, which are schematic drawings respectively illustrating a semiconductor device including a mark pattern provided by embodiments of the present invention. As shown in FIGS. 1 and 2, the embodiment provides a semiconductor device 100, and the semiconductor device 100 includes a substrate 102. A plurality of chip area 104 and a scribe line 106 are defined on the substrate 102. In accordance with the preferred embodiment, various devices such as, for example but not limited to metal-oxide-semiconductor (MOS) transistor device (not shown), for constructing integrated circuits are formed in the chip areas 104. Those skilled in the art would easily realize that the substrate 102 can include many other active and passive devices (not shown) fabricated therein and/or thereon by front-end-of-line (FEOL) process. More important, a plurality of unit cells 110$u$/110$u'$/110$u''$ are formed in the scribe line 106 as shown in FIGS. 1 and 2. The unit cells 110$u$/110$u'$/110$u''$ are formed by steps for forming the devices in the chip areas 104, therefore the unit cells 110$u$/110$u'$/110$u''$ include constructing elements with materials and spatial relationship the same with those in the chip areas 104. More important, the unit cells 110$u$/110$u'$/110$u''$ are arranged to form a mark pattern 110 in the scribe line 106 as shown in FIGS. 1 and 2. In other words, the mark pattern 110 provided by the preferred embodiments of the present invention includes a plurality of unit cells 110$u$/110$u'$/110$u''$.

It is well-known to those skilled in the art that mark pattern 110 can be, for example, a register mark pattern for lithography, an alignment mark, a monitoring and/or measuring pattern, an electrical testing pattern or a product identification (ID) code, thus the unit cells 110$u$/110$u'$/110$u''$ can be arranged to form a register patterns for lithography as shown in FIG. 1, but not limited to this. Or, the unit cells 110$u$ can be arranged to form a product ID code as shown in FIG. 1, but not limited to this. More important, the unit cells 110$u$/110$u'$/110$u''$ are immediately adjacent to each other to form the mark pattern 110.

Figure 3:
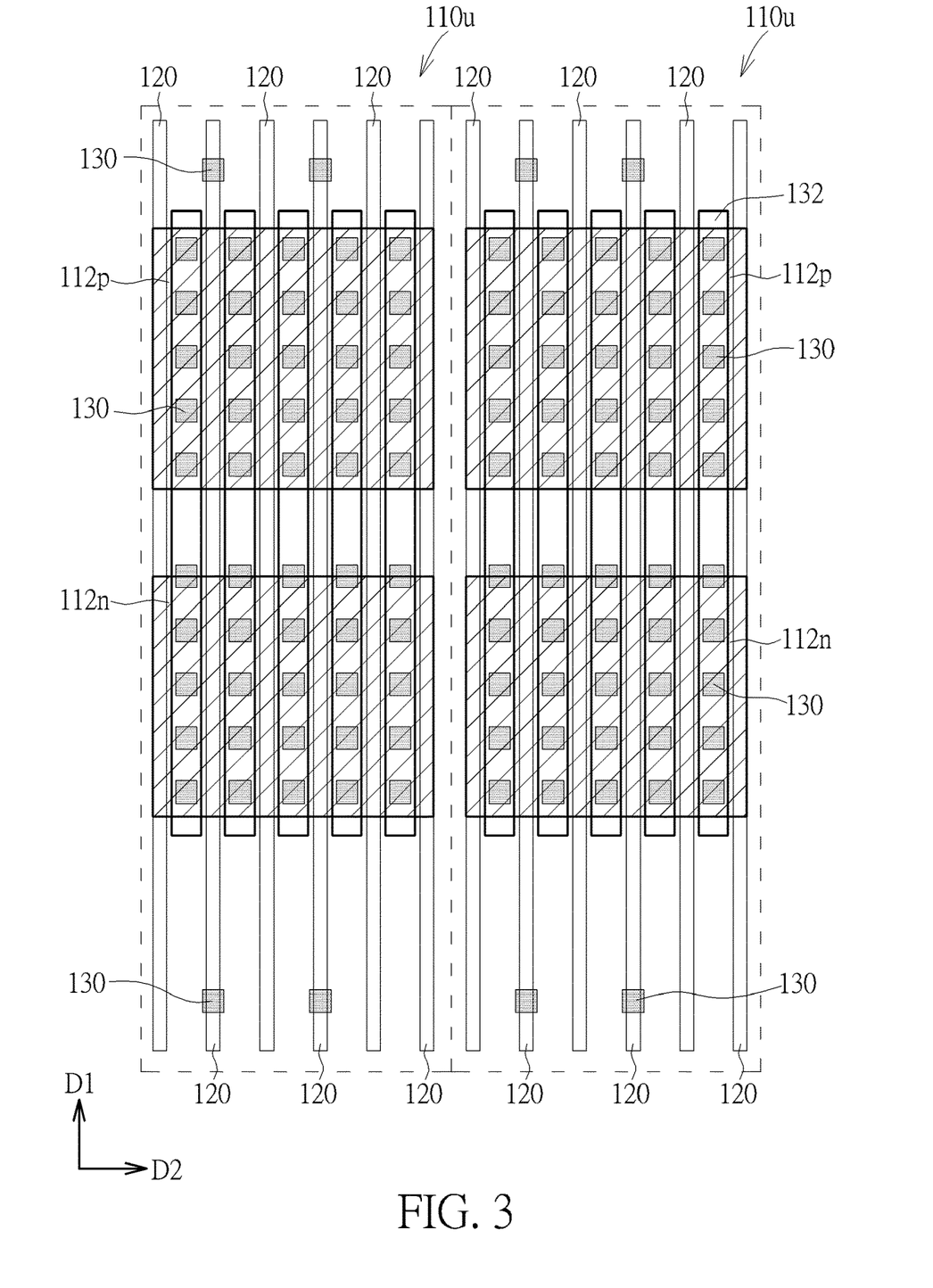
FIG. 3 is an enlarged view taken from FIGS. 1 and 2 and is a schematic drawing illustrating unit cells for forming the mark pattern provided by a first preferred embodiment.

Please refer to FIG. 3, which is an enlarged view taken from FIGS. 1 and 2 and is a schematic drawing illustrating unit cells for forming the mark pattern provided by a first preferred embodiment. As shown in FIG. 3, each of the unit cells 110$u$ includes a first active region 112$p$ and a second active region 112$n$ isolated from the first active region 112$p$.

As mentioned afore, the first active region 112$p$ and the second active region 112$n$ can be formed by steps performed to the chip areas 104, therefore the first active region 112$p$ includes a first conductivity type, the second active region 112$n$ include a second conductivity type, and the first conductivity type and the second conductivity type are complementary to each other. In the preferred embodiment, the first conductivity type is a p type and the second conductivity type is an n type, but not limited to this. The unit cell 110$u$ further includes a plurality of first gate structures 120 extending along a first direction D1 and arranged along a second direction D2 perpendicular to the first direction D1 within a substrate-horizontal plane. As shown in FIG. 3, the first gate structures 120 straddle the first active region 112$p$ and the second active region 112$n$. The unit cell 110$u$ further includes a plurality of first conductive structures 130, and the first conductive structures 130 are disposed on the first active region 112$p$, the second active region 112$n$, and two opposite ends of the first gate structures 120 as shown in FIG. 3. According to the preferred embodiment, each of the unit cells 110$u$ further includes a plurality of second conductive structures 132 extending along the first direction D1 and the straddling the first active region 112$p$ and the second active region 112$n$. And portions of the first conductive structures 130 are disposed on the second conductive structures 132, as shown in FIG. 3. Specifically speaking, the second conductive structures 132 are formed in between the first conductive structures 130 and the first active region 112$p$, and also in between the first conductive structures 130 and the second active region 112$n$ within a substrate-thickness plane.

As mentioned above, the constructing elements of the unit cells 110$u$, such as the first gate structures 120, the first conductive structures 130 and the second conductive structures 132, can be formed by the same steps performed to the chip areas 104. In other words, the first gate structures 120 can be formed simultaneously with forming the gate structures (not shown) in the chip areas 104. In the same concept, the second conductive structures 132 can be formed simultaneously with forming contact and/or slot contact (not shown) in the chip areas 104, and the first conductive structures 130 can be formed simultaneously with forming via structures (not shown) in the chip areas 104. Therefore, the pattern densities in the scribe line 106 and the chip areas 104 are similar.

Figure 4:
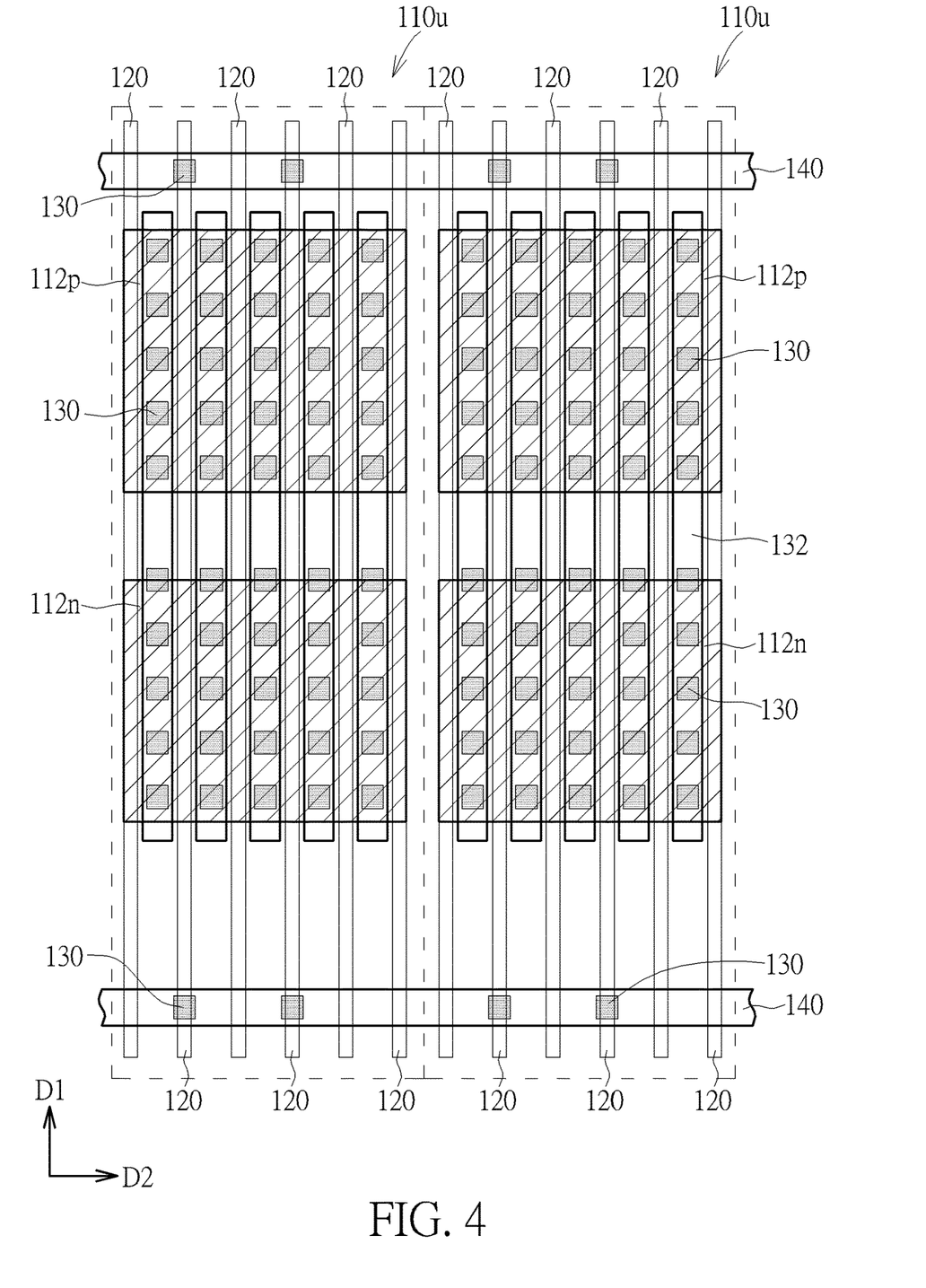
FIG. 4 is a schematic drawing illustrating a modification to the first preferred embodiment provided by the present invention.

Please refer to FIG. 4, which is a schematic drawing illustrating a modification to the first preferred embodiment provided by the present invention. According to the modification, each of the unit cells 110$u$ further includes a pair of first wiring layers 140 extending along the second direction D2. And the pair of first wiring layers 140 are respectively formed at the two opposite ends of each first gate structure 120. According to the modification, the first wiring layers 140 on the same side in different unit cells 110$u$ arranged in a same row are connected to each other as shown in FIG. 4. However, those skilled in art would easily realize that the first wiring layers 140 in different unit cells 110$u$ in the same row can be physically spaced apart from each other if required. As mentioned above, the pair of the first wiring layers 140 can be formed simultaneously with forming a wiring layer (not shown), such as a first metal wiring layer (M1) of an interconnection structure (not shown) in the chip areas 104. Therefore, the wiring pattern densities in the scribe line 106 and the chip areas 104 are similar.

Figure 5:
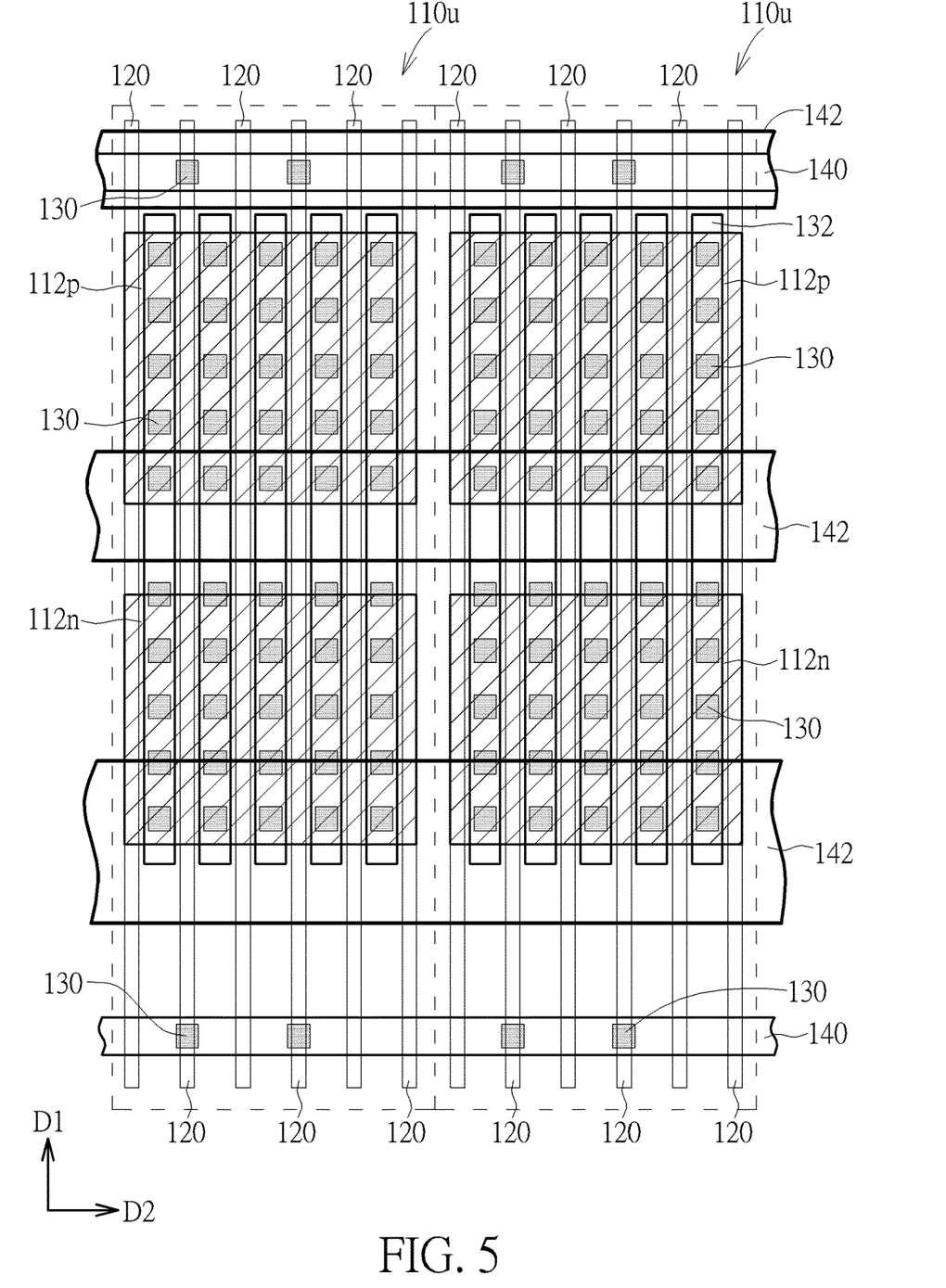
FIG. 5 is a schematic drawing illustrating another modification to the first preferred embodiment provided by the present invention.

Please refer to FIG. 5, which is a schematic drawing illustrating another modification to the first preferred embodiment provided by the present invention. According to the modification, each of the unit cells 110u further includes a plurality of second wiring layers 142 extending along the second direction D2. According to the modification, the second wiring layers 142 in different unit cells 110u in the same row are connected to each other as shown in FIG. 5. However, those skilled in art would easily realize that the second wiring layers 142 in different unit cells 110u in the same row can be physically spaced apart from each other if required. As mentioned above, the second wiring layers 140 can be formed simultaneously with forming a wiring layer (not shown), such as a second metal wiring layer (M2) of the interconnection structure (not shown) in the chip areas 104. Therefore, the wiring pattern densities in the scribe line 106 and the chip areas 104 are similar.

According to the semiconductor device 100 provided by the present invention, the mark pattern 110 formed in the scribe line 106 is constructed by the plurality of unit cells 110u, and each unit cell 110u includes configurations identical to the devices such as pMOS and nMOS formed in the chip areas 104. Therefore, pattern densities in the scribe line 106 and the chip areas 104 are made the same, and thus loading effect is mitigated. Furthermore, since the unit cells 110u respectively include elements formed in different layers such as the layer of the first gate structures 120, the layer of the second conductive structures 132, the layer of the first conductive structures 130, the layer of the first wiring layers 140, and the layer of the second wiring layers 142, it is concluded that at least those layers are involved for constructing the unit cells 110u. Thus layer-to-layer integration is easily achieved.

Figure 6:
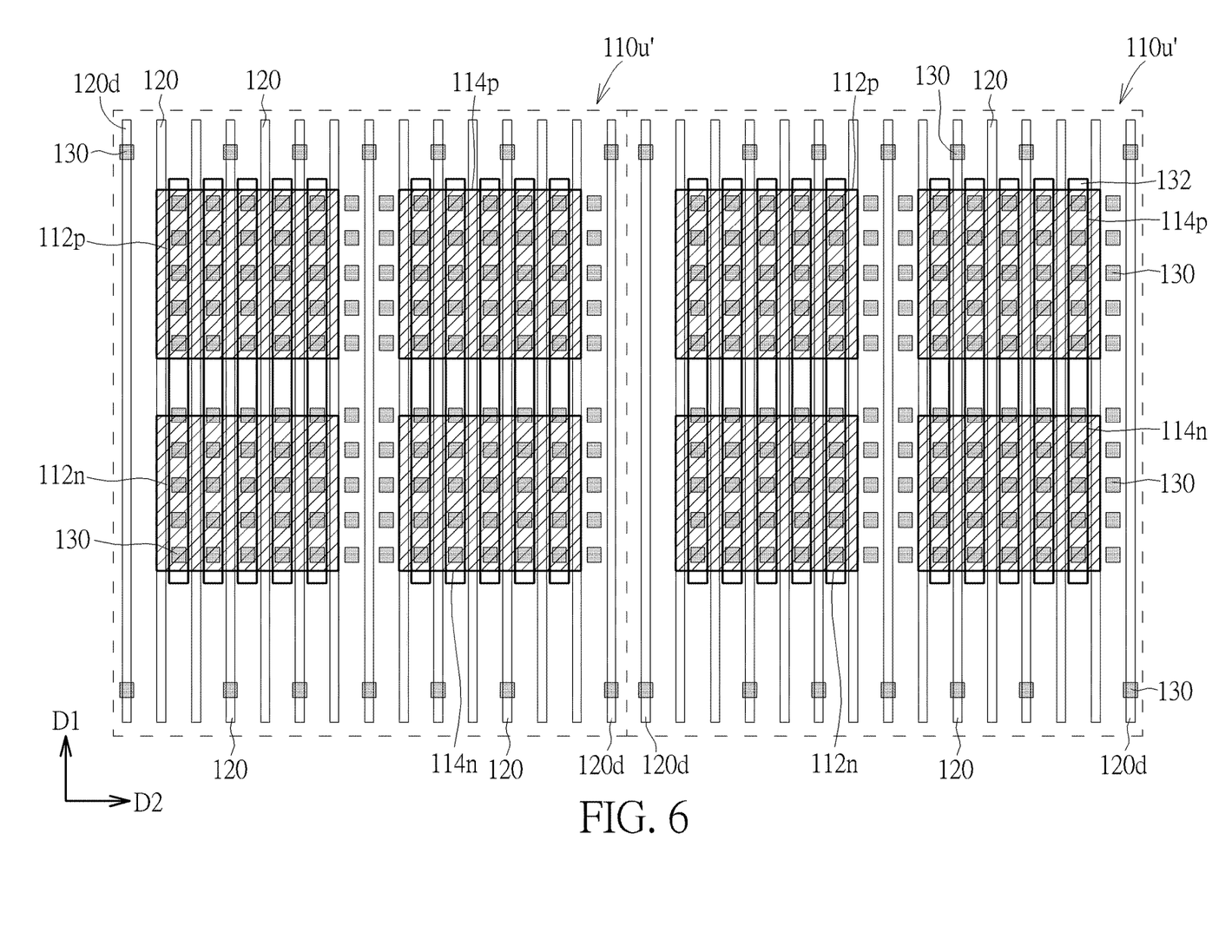
FIG. 6 is an enlarged view taken from FIGS. 1 and 2 and is a schematic drawing illustrating unit cells for forming the mark pattern provided by a second preferred embodiment.

Please refer to FIG. 6, which is an enlarged view taken from FIGS. 1 and 2 and is a schematic drawing illustrating unit cells for forming the mark pattern provided by a second preferred embodiment. As shown in FIG. 6, each of the unit cells 110u' includes a first active region 112p, a second active region 112n, a third active region 114p and a fourth active region 114n. And the first active region 112p, the second active region 112n, the third active region 114p and the fourth active region 114n are isolated from each other. As mentioned afore, those active regions 112p, 112n, 114p, and 114n can be formed by steps performed to the chip areas 104, therefore the first active region 112p and the third active region 114p include a first conductivity type, the second active region 112n and the fourth active region 114n include a second conductivity type, and the first conductivity type and the second conductivity type are complementary to each other. In the preferred embodiment, the first conductivity type is a p type and the second conductivity type is an n type, but not limited to this. More important, the first active region 112p and the third active region 114p are arranged along a second direction D2, and the second active region 112n and the fourth active region 114n are also arranged along the second direction D2. The unit cell 110u' further includes a plurality of first gate structures 120 arranged along the second direction D2 and extended along a first direction D1 perpendicular to the second direction D2 within a substrate-horizontal plane. As shown in FIG. 6, the first gate structures 120 straddle the first active region 112p and the second active region 112n, and also straddle the third active region 114p and the fourth active region 114n. In the preferred embodiment of the present invention, the unit cell 110u' can further include a pair of dummy gate structures 120d disposed at two opposite sides along the second direction D2. The unit cell 110u' further includes a plurality of first conductive structures 130. As shown in FIG. 6, the first conductive structures 130 are disposed on the first active region 112p, the second active region 112n, the third active region 114p, the fourth active region 114n and two opposite ends of the first gate structures 120. According to the preferred embodiment, each of the unit cells 110u' further includes a plurality of second conductive structures 132 extending along the first direction D1 and arranged along the second direction D2. Furthermore, the second conductive structures 132 straddle the first active region 112p and the second active region 112n, and straddle the third active region 114p and the fourth active region 114n. As shown in FIG. 6, portions of the first conductive structures 130 are disposed on the second conductive structures 132. Specifically speaking, the second conductive structures 132 are formed in between the first conductive structures 130 and the active regions 112p/112n/114p/114n within a substrate-thickness plane.

As mentioned above, the constructing elements of the unit cells 110u', such as the first gate structures 120, the first conductive structures 130 and the second conductive structures 132, can be formed by the same steps performed to the chip areas 104. In other words, the first gate structures 120 can be formed simultaneously with forming the gate structures (not shown) in the chip areas 104. In the same concept, the second conductive structures 132 can be formed simultaneously with forming contact and/or slot contact (not shown) in the chip areas 104, and the first conductive structures 130 can be formed simultaneously with forming via structures (not shown) in the chip areas 104. Therefore, the pattern densities in the scribe line 106 and the chip areas 104 are similar.

Figure 7:
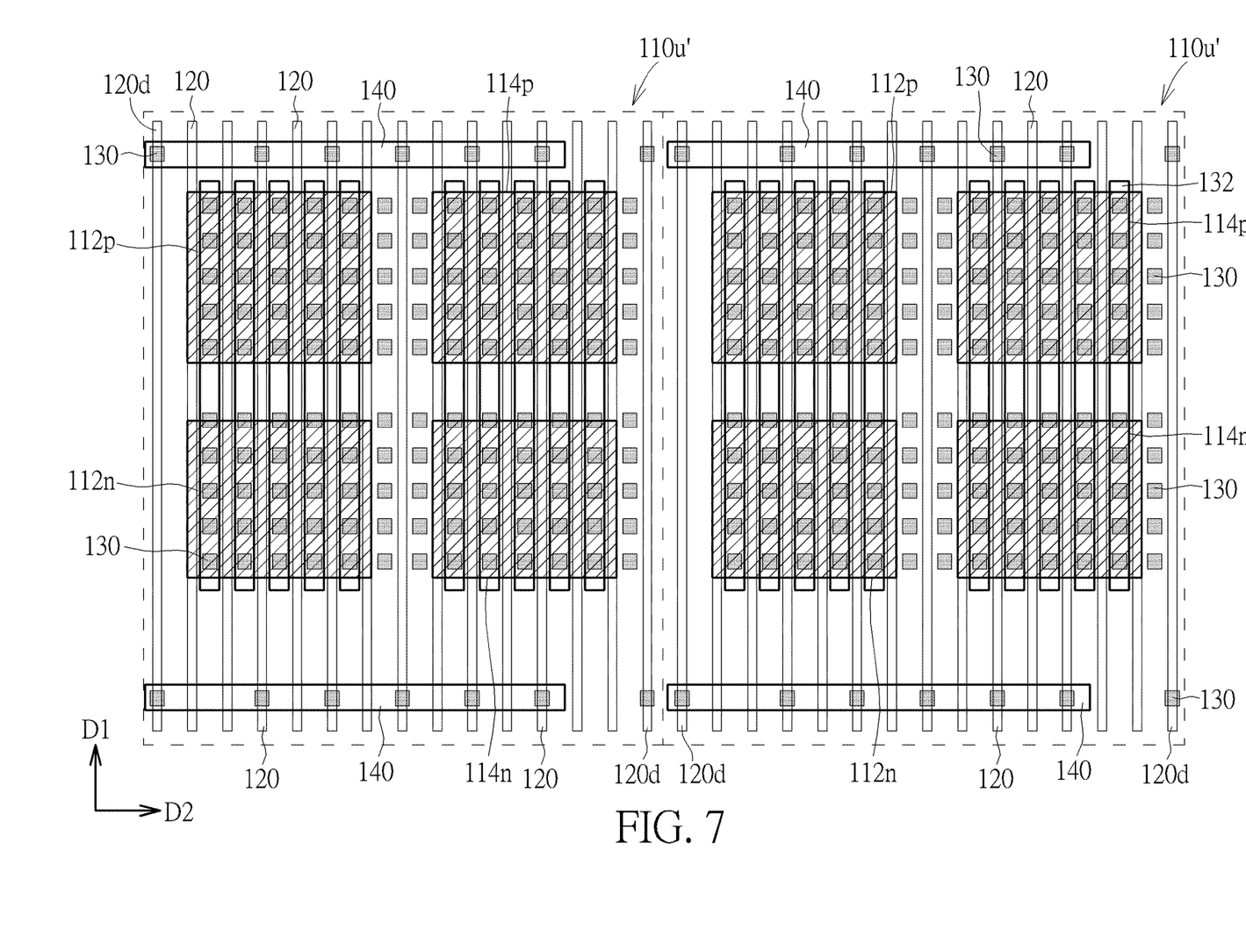
FIG. 7 is a schematic drawing illustrating a modification to the second preferred embodiment provided by the present invention.

Please refer to FIG. 7, which is a schematic drawing illustrating a modification to the second preferred embodiment provided by the present invention. According to the modification, each of the unit cells 110u' further includes a pair of first wiring layers 140 extending along the second direction D2. And the pair of first wiring layers 140 are respectively formed at the two opposite ends of portions of the first gate structures 120. According to the modification, the first wiring layers 140 on the same side indifferent unit cells 110u arranged in a same row are spaced apart from each other as shown in FIG. 7, but not limited to this. As mentioned above, the pair of the first wiring layers 140 can be formed simultaneously with forming a wiring layer (not shown), such as a first metal wiring layer (M1) of an interconnection structure (not shown) in the chip areas 104. Therefore, the wiring pattern densities in the scribe line 106 and the chip areas 104 are similar.

Figure 8:
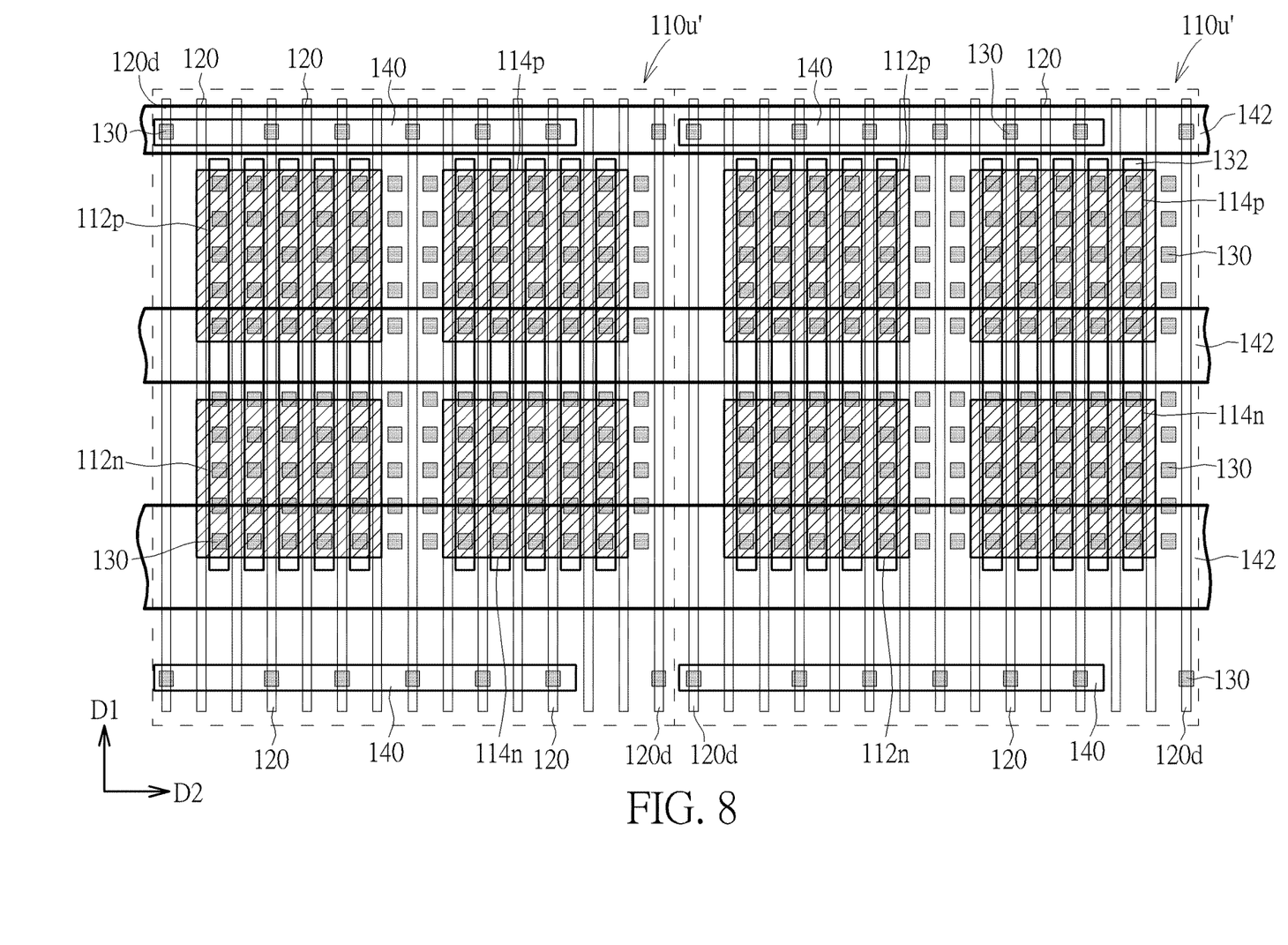
FIG. 8 is a schematic drawing illustrating another modification to the second preferred embodiment provided by the present invention.

Please refer to FIG. 8, which is a schematic drawing illustrating another modification to the second preferred embodiment provided by the present invention. According to the modification, each of the unit cells 110u' further includes a plurality of second wiring layers 142 extending along the second direction D2. According to the modification, the second wiring layers 142 in different unit cells 110u' in the same row are connected to each other as shown in FIG. 8. However, those skilled in art would easily realize that the second wiring layers 142 in different unit cells 110u' in the same row can be physically spaced apart from each other if required. As mentioned above, the second wiring layers 140 can be formed simultaneously with forming a wiring layer (not shown), such as a second metal wiring layer (M2) of the interconnection structure (not shown) in the chip areas 104. Therefore, the wiring pattern densities in the scribe line 106 and the chip areas 104 are similar.

According to the semiconductor device 100 provided by the present invention, the mark pattern 110 formed in the scribe line 106 is constructed by the plurality of unit cells 110u', and each unit cell 110u' includes configurations identical to the devices such as inverters formed in the chip areas 104. Therefore, pattern densities in the scribe line 106 and the chip areas 104 are made the same, and thus loading effect is mitigated. Furthermore, since the unit cells respectively include elements formed in different layers such as the layer of the first gate structures 120, the layer of the second conductive structures 132, the layer of the first conductive structures 130, the layer of the first wiring layers 140, and the layer of the second wiring layers 142, it is concluded that at least those layers are involved for constructing the unit cells 110u'. Thus layer-to-layer integration is easily achieved.

Figure 9:
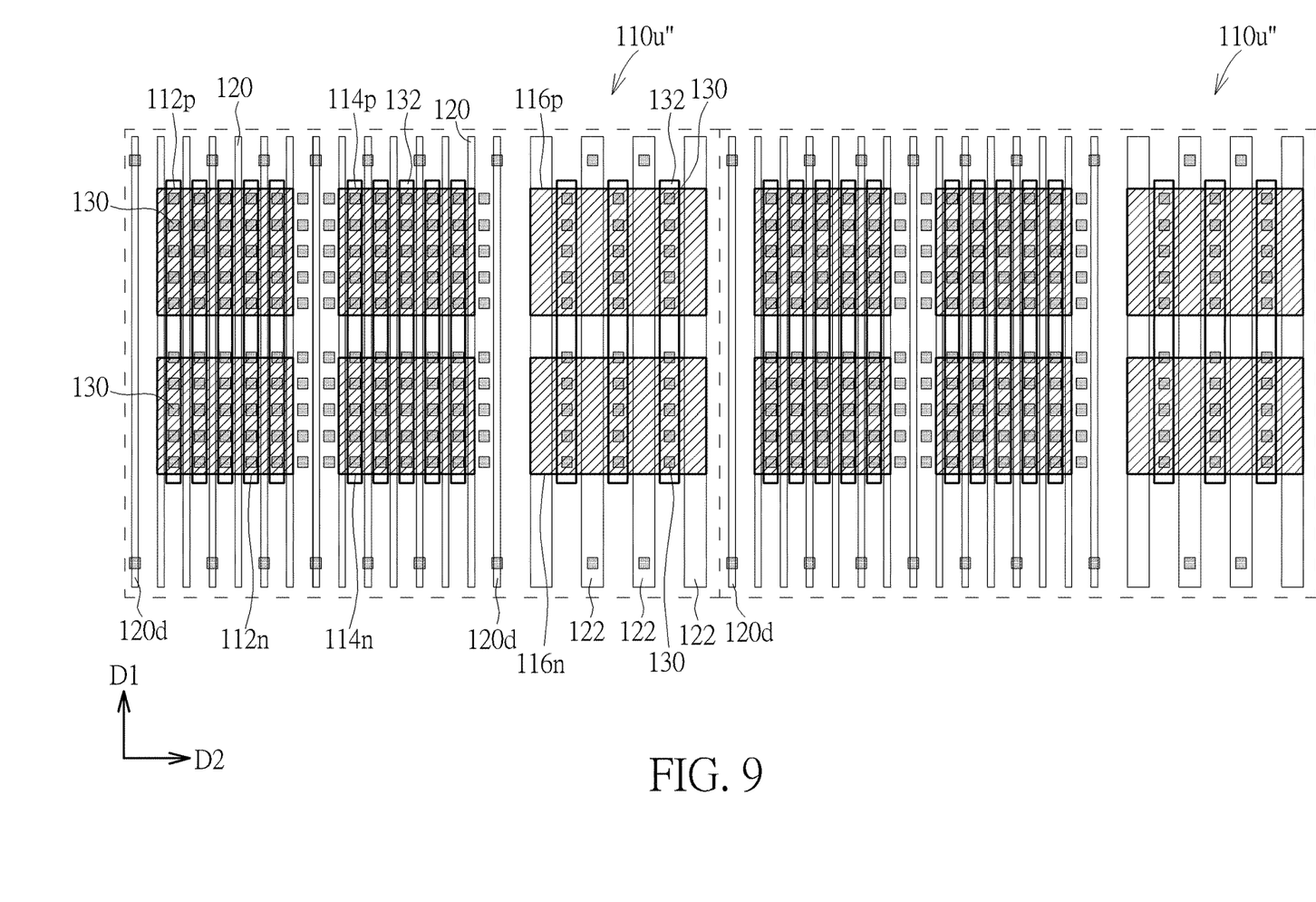
FIG. 9 is an enlarged view taken from FIGS. 1 and 2 and is a schematic drawing illustrating unit cells for forming the mark pattern provided by a third preferred embodiment.

Please refer to FIG. 9, which is an enlarged view taken from FIGS. 1 and 2 and is a schematic drawing illustrating unit cells for forming the mark pattern provided by a third preferred embodiment. As shown in FIG. 9, each of the unit cells 110u" includes a first active region 112p, a second active region 112n, a third active region 114p, a fourth active region 114n, a fifth active region 116p and a sixth active region 116n. And the first active region 112p, the second active region 112n, the third active region 114p, the fourth active region 114n, the fifth active region 116p and the sixth active region 116n are isolated from each other. As mentioned afore, those active regions 112p, 112n, 114p, 114n, 116p and 116n can be formed by steps performed to the chip areas 104, therefore the first active region 112p, the third active region 114p and the fifth active region 116p include a first conductivity type, the second active region 112n, the fourth active region 114n and the sixth active region 116n include a second conductivity type, and the first conductivity type and the second conductivity type are complementary to each other. In the preferred embodiment, the first conductivity type is a p type and the second conductivity type is an n type, but not limited to this. More important, the first active region 112p, the third active region 114p and the fifth active region 116p are arranged along a second direction D2, and the second active region 112n, the fourth active region 114n and the sixth active region 116n are also arranged along the second direction D2. The unit cell 110u" further includes a plurality of first gate structures 120 and a plurality of second gate structure 122. Both of the first gate structures 120 and the second gate structures 122 are arranged along the second direction D2 and extended along a first direction D1 perpendicular to the second direction D2 within a substrate-horizontal plane. In the preferred embodiment of the present invention, the unit cell 110u" can further include at least a dummy gate structure 120d disposed between one first gate structure 120 and one second gate structure 122, and the dummy gate structure 120d is also extended along the second direction D2. As shown in FIG. 9, the first gate structures 120 straddle the first active region 112p and the second active region 112n, and also straddle the third active region 114p and the fourth active region 114n while the second gate structures 122 straddle the fifth active region 116p and the sixth active region 116n. The unit cell 110u" further includes a plurality of first conductive structures 130. As shown in FIG. 9, the first conductive structures 130 are disposed on the first active region 112p, the second active region 112n, the third active region 114p, the fourth active region 114n, the fifth active region 116p, the sixth active region 116n, and two opposite ends of the first gate structures 120 and the second gate structures 122. According to the preferred embodiment, each of the unit cells 110u" further includes a plurality of second conductive structures 132 extending along the first direction D1 and the straddling the first active region 112p and the second active region 112n. The second conductive structures 132 also straddle the third active region 114p and the fourth active region 114n, and straddle the fifth active region 116p and the sixth active region 116n. As shown in FIG. 9, portions of the first conductive structures 130 are disposed on the second conductive structures 132 in the substrate-thickness plane.

As mentioned above, the constructing elements of the unit cells 110u", such as the first gate structures 120, the second gate structures 122, the first conductive structures 130 and the second conductive structures 132, can be formed by the same steps performed to the chip areas 104. In other words, the first gate structures 120 and the second gate structures 122 can be formed simultaneously with forming the gate structures (not shown) in the chip areas 104. In the same concept, the second conductive structures 132 can be formed simultaneously with forming contact and/or slot contact (not shown) in the chip areas 104, and the first conductive structures 130 can be formed simultaneously with forming via structures (not shown) in the chip areas 104. Therefore, the pattern densities in the scribe line 106 and the chip areas 104 are similar.

Figure 10:
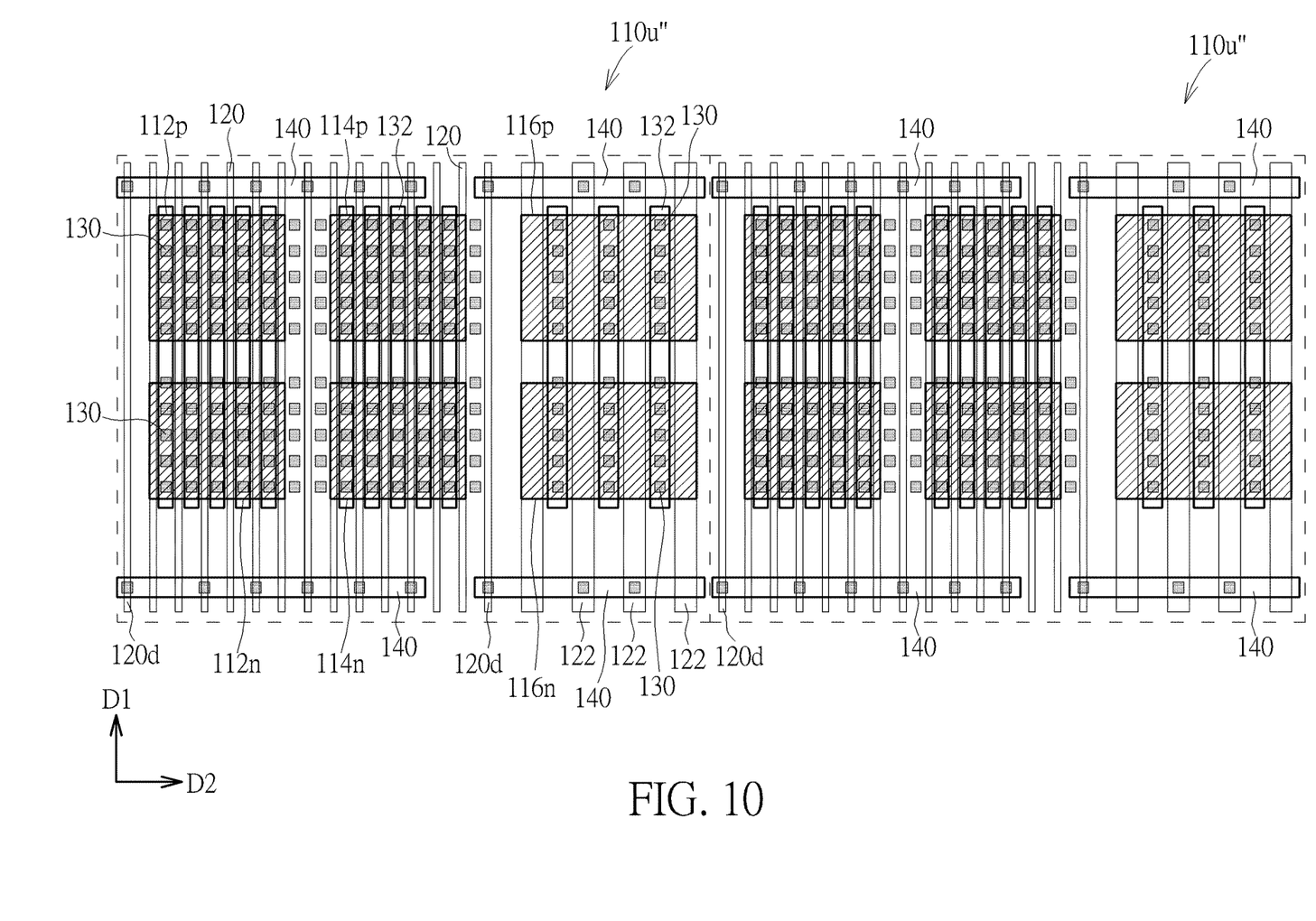
FIG. 10 is a schematic drawing illustrating a modification to the third preferred embodiment provided by the present invention.

Please refer to FIG. 10, which is a schematic drawing illustrating a modification to the third preferred embodiment provided by the present invention. According to the modification, each of the unit cells 110u" further includes a pair of first wiring layers 140 extending along the second direction D2. And the pair of first wiring layers 140 are respectively formed at the two opposite ends of the first gate structures 120 and the second gate structures 122. According to the modification, the first wiring layers 140 on the same side in one single unit cell 110u" are spaced apart from each other, and the first wiring layers 140 on the same side in different unit cells 110u" arranged in a same row are spaced apart from each other as shown in FIG. 10, but not limited to this. As mentioned above, the pair of the first wiring layers 140 can be formed simultaneously with forming a wiring layer (not shown), such as a first metal wiring layer (M1) of an interconnection structure (not shown) in the chip areas 104. Therefore, the wiring pattern densities in the scribe line 106 and the chip areas 104 are similar.

Figure 11:
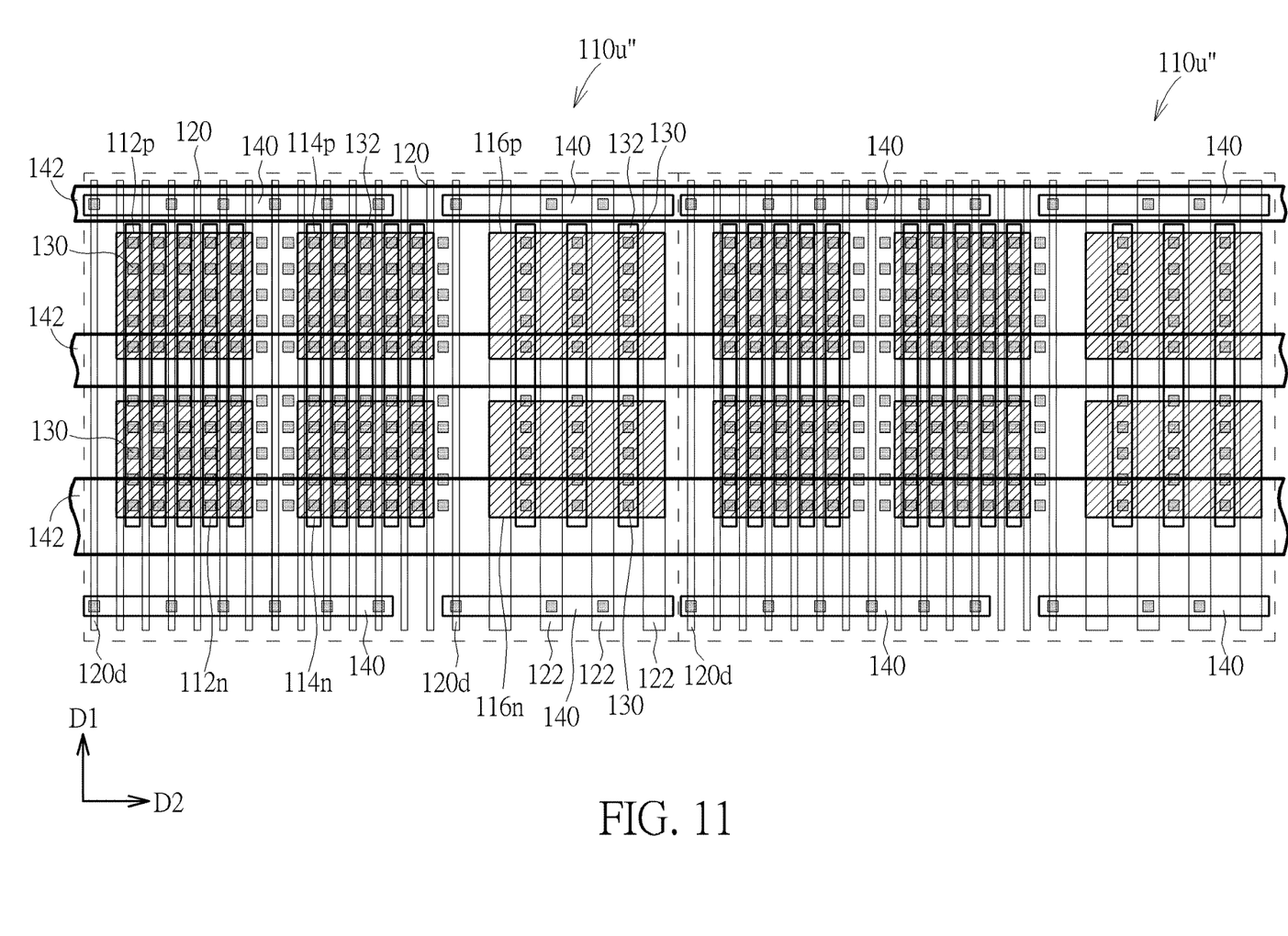
FIG. 11 is a schematic drawing illustrating another modification to the third preferred embodiment provided by the present invention.

Please refer to FIG. 11, which is a schematic drawing illustrating another modification to the third preferred embodiment provided by the present invention. According to the modification, each of the unit cells 110u" further includes a plurality of second wiring layers 142 extending along the second direction D2. According to the modification, the second wiring layers 142 in different unit cells 110u" in the same row are connected to each other as shown in FIG. 11. However, those skilled in art would easily realize that the second wiring layers 142 in different unit cells 110u" in the same row can be physically spaced apart from each other if required. As mentioned above, the second wiring layers 140 can be formed simultaneously with forming a wiring layer (not shown), such as a second metal wiring layer (M2) of the interconnection structure (not shown) in the chip areas 104. Therefore, the wiring pattern densities in the scribe line 106 and the chip areas 104 are similar.

According to the semiconductor device 100 provided by the present invention, the mark pattern 110 formed in the scribe line 106 is constructed by the plurality of unit cells 110u", and each unit cell 110u" includes configurations identical to the devices such as inverter(s) formed in core region(s) and pMOS/nMOS formed in I/O region(s) in the chip areas 104. Therefore, pattern densities in the scribe line 106 and the chip areas 104 are made the same, and thus loading effect is mitigated. Furthermore, since the unit cells respectively include elements formed in different layers such as the layer of the first gate structures 110 and the second gate structures 112, the layer of the second conductive structures 132, the layer of the first conductive structures 130, the layer of the first wiring layers 140, and the layer of the second wiring layers 142, it is concluded that at least those layers are involved for constructing the unit cells 110u'''. Thus layer-to-layer integration is easily achieved.

According to the semiconductor devices provided by the present invention, the mark pattern formed in the scribe line is constructed by the plurality of unit cells, and each unit cells includes configurations identical to the devices formed in the chip areas. Therefore, pattern densities in the scribe line and the chip areas are made the same, and thus loading effect is mitigated. Secondly, since the unit cells are formed in the scribe line simultaneously with forming the devices formed in the chip areas, the size of the unit cells is adjustable, depending on what kind of devices are to be formed in the chip areas. Therefore, the mark pattern of the semiconductor device provided by the present invention includes a superior flexibility. Furthermore, since the unit cells respectively include elements formed in different layers, it is concluded that at least those layers are involved for constructing the unit cells. Thus layer-to-layer integration is easily achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising:
   a substrate comprising a plurality of chip areas and a scribe line defined thereon; and
   a mark pattern disposed in the scribe line, the mark pattern comprising a plurality of unit cells immediately adjacent to each other and arranged in a form of dot matrix to form a register mark or an identification code, and each unit cell has configuration identical to devices of pMOS and nMOS formed in the chip areas, comprising:
   a first active region;
   a second active region isolated from the first active region, wherein a conductivity type of the first active region is complementary to a conductivity type of the second active region;
   a plurality of first gate structures extending along a first direction and arranged along a second direction perpendicular to the first direction, and the first gate structures straddling the first active region and the second active region;
   a plurality of contact structures disposed between the first gate structures on the first active region and the second active region; and
   a plurality of via structures disposed on the contact structures and two opposite ends of the first gate structures.

2. The semiconductor device according to claim 1, wherein the first active region comprises a first conductivity type, the second active region comprises a second conductivity type, and the first conductivity type and the second conductivity type are complementary to each other.

3. The semiconductor device according to claim 1, wherein each of the unit cells comprises a plurality of second conductive structures extending along the first direction and the straddling the first active region and the second active region.

4. The semiconductor device according to claim 3, wherein portions of the first conductive structures are disposed on the second conductive structures.

5. The semiconductor device according to claim 1, wherein each of the unit cells further comprises a pair of first wiring layers extending along the second direction, and respectively formed at the two opposite ends of the first gate structures.

6. The semiconductor device according to claim 5, wherein the first wiring layers of the unit cells in a same row are connected to each other.

7. The semiconductor device according to claim 5, wherein each of the unit cells further comprises a plurality of second wiring layers extending along the second direction.

8. The semiconductor device according to claim 7, wherein the second wiring layers of the unit cells in a same row are connected to each other.

9. The semiconductor device according to claim 1, wherein each of the unit cells further comprises a third active region and a fourth active region, the first active region and the third active region are arranged along the second direction, the second active region and the fourth active region are arranged along the second direction, and the first gate structures further straddling the third active region and the fourth active region.

10. The semiconductor device according to claim 9, wherein the first active region and the third active region comprise a first conductivity type, the second active region and the fourth active region comprise a second conductivity type, and the first conductivity type and the second conductivity type are complementary to each other.

11. The semiconductor device according to claim 10, wherein the first conductive structures are disposed in the third active region and the fourth active region.

12. The semiconductor device according to claim 10, wherein each of the unit cells further comprise a fifth active region comprising the first conductivity type and a sixth active region comprising the second conductivity type.

13. The semiconductor device according to claim 12, wherein the first active region, the third active region and the fifth active region are arranged along the second direction, and the second active region, the fourth active region and the sixth active region are arranged along the second direction.

14. The semiconductor device according to claim 12, wherein the first conductive structure are disposed in the third active region and the fourth active region, the fifth active region and the sixth active region.

15. The semiconductor device according to claim 12, wherein each of the unit cells further comprises a plurality of second gate structures straddling the fifth active region and the sixth active region.

16. The semiconductor device according to claim 15, wherein each of the unit cells further comprising a plurality of first wiring layers respectively formed at two opposite ends of the first gate structures and the second gate structures.

17. The semiconductor device according to claim 12, wherein each of the unit cells further comprises a plurality of second wiring layers extending along the second direction.

18. The semiconductor device according to claim 17, wherein the second wiring layers of the unit cells in a same row are connected to each other.

* * * * *